United States Patent
DeBrosse et al.

(10) Patent No.: US 6,704,230 B1
(45) Date of Patent: Mar. 9, 2004

(54) ERROR DETECTION AND CORRECTION METHOD AND APPARATUS IN A MAGNETORESISTIVE RANDOM ACCESS MEMORY

(75) Inventors: John K. DeBrosse, Colchester, VT (US); Heinz Hoenigschmid, Essex Junction, VT (US); Rainer Leuschner, Mohegan Lake, NY (US); Gerhard Mueller, Meitingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,201

(22) Filed: Jun. 12, 2003

(51) Int. Cl.[7] .............................. G11C 29/00; G11C 7/00
(52) U.S. Cl. ...................... 365/201; 365/158; 365/222; 714/721
(58) Field of Search ................................. 365/201, 222, 365/158; 714/721

(56) References Cited

U.S. PATENT DOCUMENTS

| | | | |
|---|---|---|---|
| 5,373,512 A | * 12/1994 | Brady | .................. 714/767 |
| 5,828,513 A | * 10/1998 | Greenberg | .............. 360/77.08 |
| 6,490,217 B1 | 12/2002 | DeBrosse et al. | |
| 6,548,589 B2 | * 4/2003 | Widmer et al. | ............. 524/457 |

* cited by examiner

Primary Examiner—Son T. Dinh
(74) Attorney, Agent, or Firm—Daryl Neff; Margaret A. Pepper

(57) ABSTRACT

The present invention relates to a method and apparatus for reducing data errors in a magneto-resistive random access memory (MRAM). According to the disclosed method, data bits and associated error correction code (ECC) check bits are stored into a storage area. Thereafter, the data bits and ECC check bits are read out and any errors are detected and corrected. A data refresh is then initiated based on a count and data bits and associated ECC check bits stored in the storage area are then refreshed by accessing the stored data bits and the associated ECC check bits, and ultimately by checking, correcting and restoring the data bits and the ECC check bits to the storage area.

20 Claims, 3 Drawing Sheets

TJ STACK
(600)

ERROR DETECTION AND CORRECTION METHOD AND APPARATUS IN A MAGNETORESISTIVE RANDOM ACCESS MEMORY

BACKGROUND OF INVENTION

The invention relates to a method and apparatus for reducing data errors generated in a magneto-resistive random access memory (MRAM), and more particularly to a method of reducing switching currents in order to protect data integrity in an MRAM.

A recent development combines semiconductor technology with principles of magnetism to make magneto-resistive random access memory (MRAM) devices. In this approach, generation of electrical charge to indicate the presence of a binary "1" or "0" is replaced by the spin of an electron, obtained by means of using magnetic layers.

MRAMs include large numbers, of conductive lines positioned perpendicular to one another in different metal layers. The places where the perpendicular conductive lines intersect are known as the cross-points. At each cross-point, a magnetic stack is placed between the two perpendicular conductive lines.

Binary information, represented as a "0" or "1", is stored as different alignments of the magnetic dipoles in the magnetic-stack. At the cross-point, an electrical current flowing through one of the conductive lines induces a magnetic field around the conductive line. In this way, the induced magnetic field can align the orientation of magnetic dipoles in the magnetic stack. A different current flowing through the other conductive line induces another magnetic field and can realign the polarity of the magnetic field in the magnetic stack. A current of sufficient strength flowing through one of the conductive lines is able to destroy the contents of the magnetic stacks coupled to it. However, currents flowing through both conductive lines are required to selectively program a particular magnetic stack.

The alignment of the magnetic dipoles in the magnetic stack changes the electrical resistance of the magnetic stack. For example, if a binary "0" is stored in the magnetic stack, the resistance of the magnetic stack will be different from the resistance of the same magnetic stack if a binary "1" is stored in it. It is the resistance of the magnetic stack that when detected, determines the logical value stored therein.

Because MRAM devices operate differently than other semiconductor memory devices, they introduce design and manufacturing challenges. One of these challenges has to do with the generation of "soft-errors". A "soft-error" is a failure that only corrupts the data, while not affecting the circuit itself.

There are a number of causes associated with the generation of "soft-errors". For example, "soft-errors" may be generated by unintended realignment of magnetic dipoles. Such reversals can ultimately affect the resistance of the magnetic stack and the binary value stored in the magnetic stack. As the operating voltages and size of microelectronic devices continue to shrink to satisfy the demand for low power, high density semiconductor devices are being used more widely. However, high density semiconductor devices create higher thermal characteristics that lead to such realignments.

A second, closely associated, challenge affecting data integrity occurs during writing of data streams in an MRAM. It is well known to those skilled in the art that the magnetic selectivity of an ideal magnetic memory cell occurs along a hard magnetic axis, often representing the word line field, and an easy magnetic axis, which represents the bit line field. Since MRAM storage cells are placed at cross-points between word lines and bit lines, and writing is performed by locally elevated magnetic fields, writing to individual memory cells without also writing to adjacent or other non-intended cells can be sometimes problematic. This is because, typically, writing a memory cell involves passing electrical currents simultaneously through the bit line and the word line at the cross-point where the selected cell is located. The selected cell is subjected to a magnetic field which is the vector sum of the magnetic fields created by the word and bit line currents. All other cells that share the same bit line or the same word line as the selected cell will be half-selected, and will thus be subjected to either the bit line magnetic field or the word line magnetic field. As known in the art, the vector sum of the magnetic fields of the word line and the bit line is only slightly larger than the individual magnetic fields of the word line or the bit line, such that the selectivity of a selected cell over half-selected cells is poor, especially when the non-uniform switching characteristics of the cells are considered. The difference between the magnetic field strength at a selected cell and that of a half-selected cell is known as write select margin.

Variations in the shapes or sizes of cells within an MRAM can give rise to variations in magnetic thresholds of the cells which are so large that it may become impossible to write a selected cell without unintentionally reversing the stored states in some of the half-selected cells, thus placing the reliability and validity of the stored data in question. There may also be environmental or other factors, such as temperature and processing variations, that adversely affect the write select margin. Additionally, the spontaneous switching of states in a cell, when it is subjected to repeated reversals of the magnetic field that are lower the nominal switching field narrows the acceptable write select margin further, making greater selectivity of individual cells imperative. An illustrative example is presented in FIG. 1.

FIG. 1 is a prior art diagram illustrating the magnetic selectivity of an MRAM cell. Assume that the currents of the word line and the bit line crossing at a particular MRAM cell generate fields along the hard magnetic axis at point (110), and along the easy magnetic axis at point (130), respectively. The field (Hx, Hy) required to switch the magnetic state of the cell must equal or exceed the boundary (100). This boundary curve (100), known by those skilled in the art as a switching asteroid, satisfies the relation $Hx^{2/3}+Hy^{2/3}=Hk^{2/3}$, where Hx is the hard axis field, Hy is the easy axis field, and Hk is an anisotropy field. A selected MRAM is subjected to magnetic fields outside the boundary (100) of the switching asteroid, e.g., corresponding to point (120)) which are large enough to write the MRAM cell to a state that aligns with the easy axis field direction. The state of a half-selected cell does not change, since the magnetic fields acting on it, (that is, the fields corresponding to points, (110) and (130) remain within the boundary (100) of the switching asteroid.

Other than these challenges affecting data integrity, there are numerous other concerns which may have adverse effects on data including operating conditions such as temperature and electrical charge. Regardless of the cause of data integrity problems, however, new systems and methods are needed to eliminate, or at least minimize their effects on MRAM operation. The present invention provides a system and method for resolution of errors affecting data integrity that is easy to implement without being cost prohibitive.

It should be noted, in the description of the invention to follow, that while, for illustrative purposes, the first two challenges discussed above are used throughout to highlight the benefits of the present invention, in particular as to handling unintended reversals, the present invention can be applied to other situations where data errors are to be minimized to preserve data integrity.

SUMMARY OF INVENTION

The present invention relates to a method and apparatus for reducing data errors in a magneto-resistive random access memory (MRAM). According to a method provided by the invention, data bits and error correction code (ECC) check bits are stored into a storage area. The data bits and the ECC check bits are then read out and errors in the data bits are checked and corrected with the ECC check bits. A data refresh is then initiated based on a count and data bits and associated ECC check bits stored in the storage area are then refreshed by accessing the stored data bits and the associated ECC check bits, and ultimately by checking, correcting and restoring the data bits and the ECC check bits to the storage area. In an embodiment of the invention, the stored data bits and ECC check bits are refreshed based on certain other criteria, to further increase tolerance of the MRAM to errors.

DETAILED DESCRIPTION

A first embodiment of the invention relies upon use of an error correction code (ECC) for checking and correcting errors in data stored in an MRAM to permit switching currents of the MRAM to be reduced. Many advantages flow from lowering switching currents, as will be described more fully below. Further according to another embodiment of the invention, error detection and correction is combined with a refresh cycle to achieve greater benefits than possible by use of ECC alone or refresh cycle alone.

Figure 1:
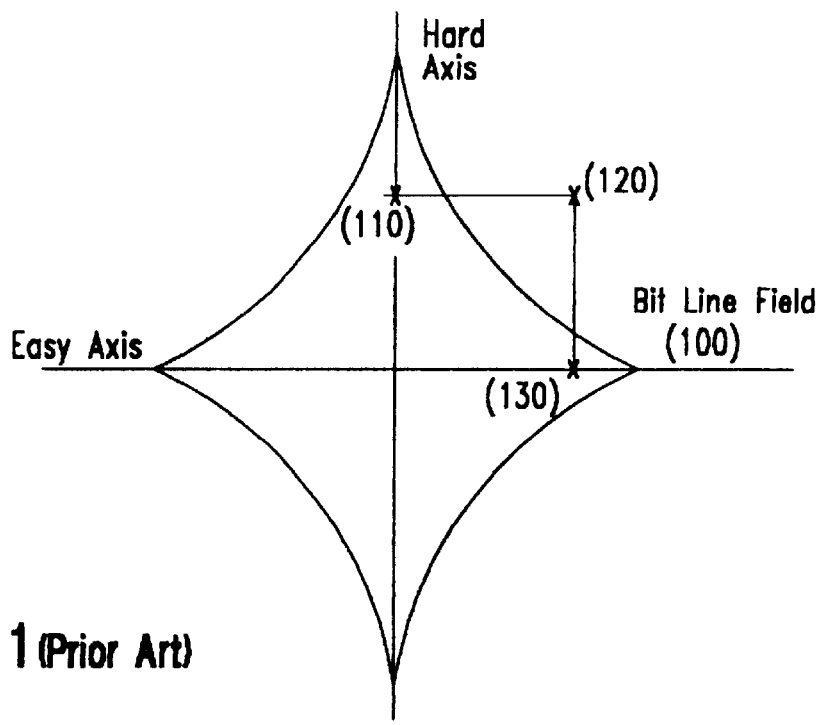
FIG. 1 is a prior art diagram illustrating the magnetic selectivity of an MRAM cell.
Figure 2:
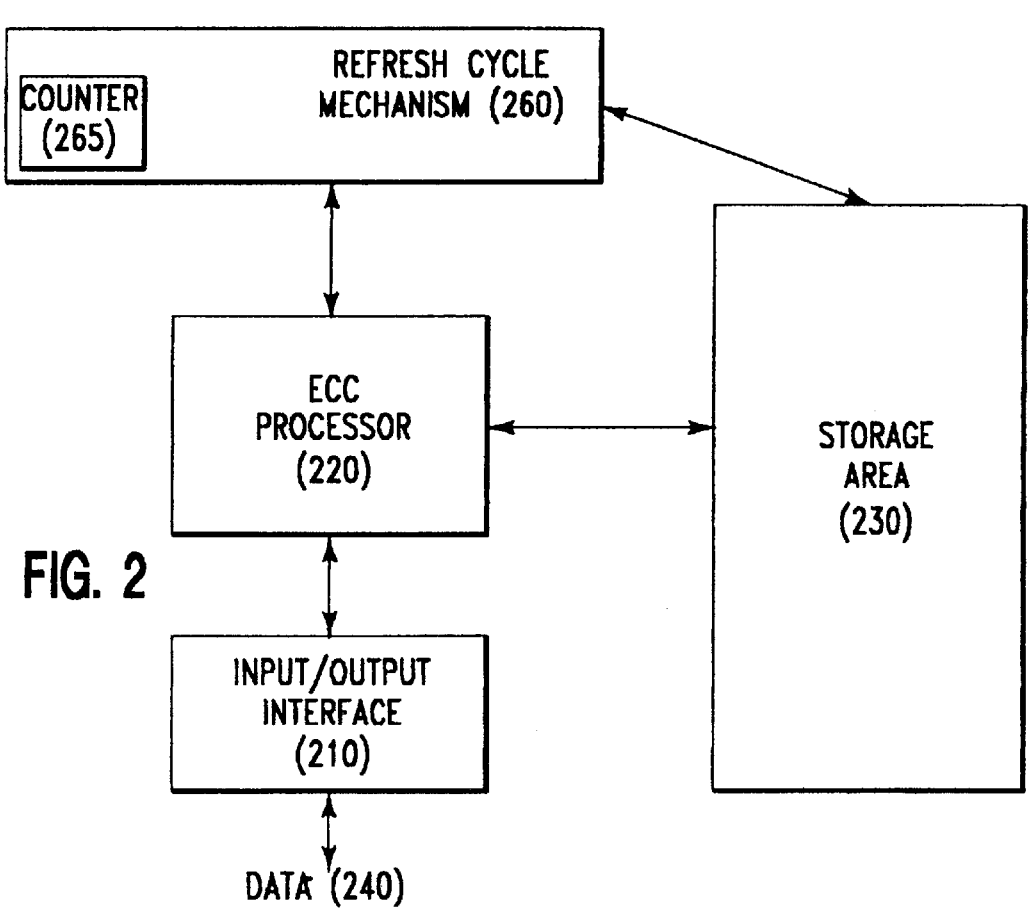
FIG. 2 is a block diagram per an embodiment of the invention, showing a system using both an error correction (ECC) and a refresh cycle mechanism.

A system block diagram as per one embodiment of the present invention is illustrated in FIG. 2. In such embodiment, an input output (I/O) interface (210) receives data (240) that is to be processed. The I/O interface (210) is in electronic communication with an ECC processor (220) which generates ECC check bits for data bits received from the I/O interface (210). Data bits and associated ECC check bits are then stored in the MRAM storage area (230). The ECC check bits can be encoded according to any one of many different variety of error correction codes such as Hamming codes, parity bits, and many others, as known to those skilled in the art. When the data bits are read out later from the storage area (230), the ECC processor (220) checks them for errors using the associated ECC check bits retrieved from the storage area (230).

In an alternative embodiment, a refresh cycle mechanism (260) is used to control time and manner in which the information including data bits and ECC check bits stored in the storage area (230) are refreshed. The refresh cycle mechanism (260) is in electronic communication with the storage area (230). In an embodiment of the invention, the refresh cycle mechanism (260) is also in electronic communication with the ECC processor (220). The refresh cycle mechanism (260) controls the performance of operations to refresh the stored information. Refreshing the stored information includes retrieving the data bits and ECC check bits stored a particular location of the storage area (230), at which time the ECC processor (220) checks and corrects errors in them, and then restoring the refreshed values of the data bits and the ECC check bits to the storage area (230). A location in the MRAM storage area (230) can be refreshed, by restoring checked and corrected information at times when the contents of the location are read out as data (240) provided externally from I/O interface (210). Another way that the stored information can be refreshed is to systematically retrieve the information from some or all locations of the storage area (230) without requiring data (240) to be transferred externally over the I/O interface (210). In a particular embodiment, the refresh cycle mechanism (260) includes a refresh counter (265) for triggering refresh operations based on certain criteria, as will be described more fully below.

Although both error detection and correction, and refresh cycles improve data integrity, as discussed in greater detail below, the benefits of combining the two are numerous. For one, any disadvantages associated with the use of either mechanism alone is reduced by careful control and use of the other complementary mechanism. In addition, both error detection and correction, and refresh cycles allow power consumption to be reduced, in a system already struggling with power consumption concerns. These and other advantages can be better understood by exploring the relationships illustrated in FIGS. 3 through 5.

Figure 3:
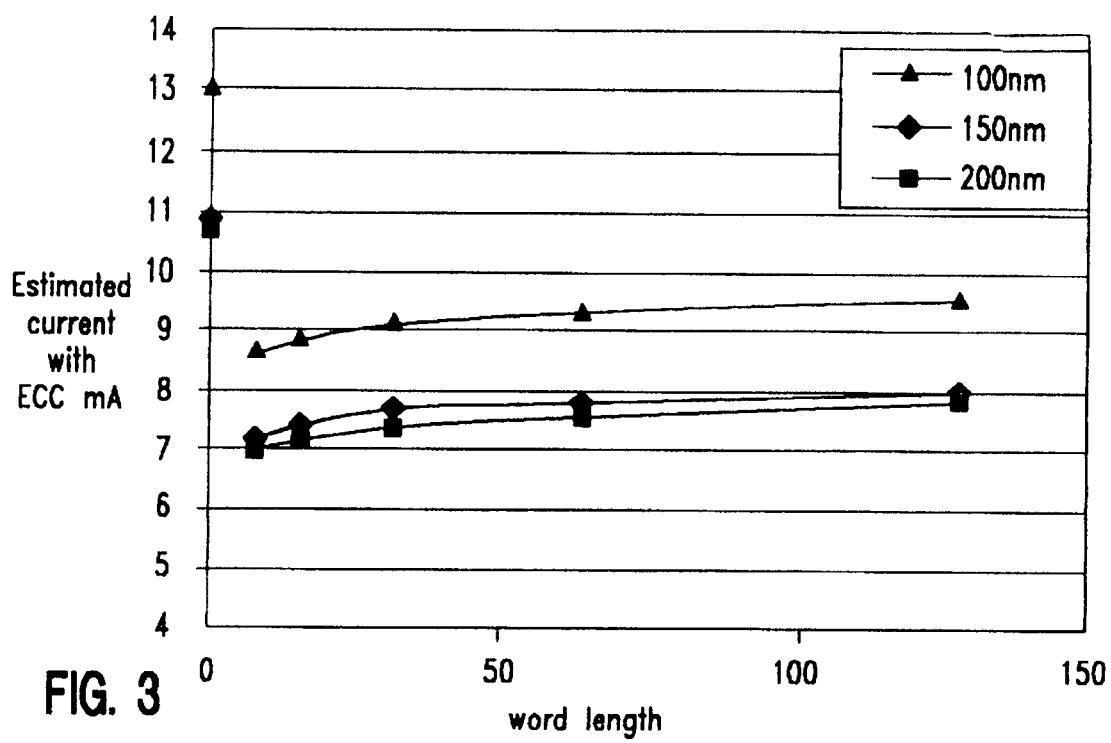
FIG. 3 is a diagram illustrating the relationship between switching currents and variable tunnel junction (TJ) widths of an MRAM.

FIG. 3 illustrates the switching currents required after storing a data bit in words of a variety of different lengths, with and without the use of ECC, for different widths of tunnel junctions (TJs) of memory cells within the MRAM. As will be understood by examining FIG. 3, high switching currents of about 11 mA and 13 mA for different TJ widths, respectively, are needed when ECC is not used, as shown by the data points on the vertical axis of the diagram (where the word length of zero indicates ECC is not used). As indicated by the curves shown for different word lengths including ECC bits, lower switching currents in the ranges of 7 mA and 9 mA, respectively, are permitted when ECC is used, even for relatively long word lengths.

Some information regarding the structure of memory cells within an MRAM is now necessary. In an MRAM cell, a tunnel junction (TJ) is located between a switching transistor and a current supply line, in such a way so that one magnetic field is generated with the passing of the current through the current supply line. The conductor is in most cases orthogonal to the current supply line and is responsible for generating the second magnetic field. A cross sectional illustration of a TJ (also, known as a magnetic tunnel junction (MTJ) stack is provided in FIG. 6.

Figure 6:
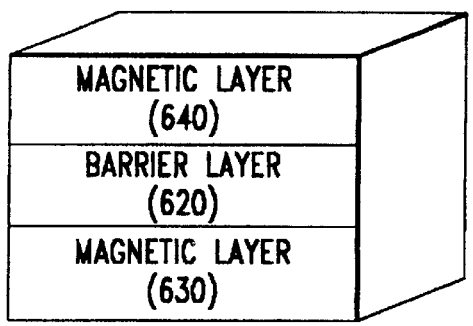
FIG. 6 is a cross sectional depiction of a TJ.

As shown in FIG. 6, TJ stack (600) is comprised of layered metals that exhibit high magneto-resistance characteristics at ambient temperatures. The layered metals of FIG.

6 comprise a barrier layer (620), such as a layer of oxide, sandwiched between two magnetic layers (630) and (640). Note that while the MRAM operates like a spin valve, in this respect, the current flows perpendicular to the plane of the layers. One of the two magnetic layers in the TJ is a "free" layer with its magnetization being oriented by an external magnetic field, while the other layer is a fixed or "anchored layer" with its magnetization direction being anchored by an anti-ferromagnetic exchange field.

A tunnel junction (TJ), therefore, is capable of being switched between high resistance and low resistance states. When the magnetization of the magnetic layers is anti-parallel, the resistance of the junction is high, and when the magnetization is parallel, the resistance is low. The relative variation of the resistance between these two states may be up to 40% by appropriate choice of materials. In this manner, the desired binary "0" and "1" values are generated. Similarly, the operation of the TJ determines whether the device is in a "write" mode or in a "read" mode.

Since errors that affect data occur in write mode, a thorough discussion of the read mode will not be presented here. It suffices to mention that in read mode, the switching transistor of the MRAM cell is held in the saturated condition (i.e. the current flowing through it is at a maximum) by a positive current pulse in its base. The current flowing through line only passes through the memory cell whose transistor is open. This current enables the resistance of the junction to be measured. By comparison with a reference memory cell, the state of the memory cell ("0" or "1") is then established.

In write mode, by contrast, the transistor is blocked and the current flows through the current supply line and the conductor. In this case, the TJ is subjected to two orthogonal magnetic fields, one field being applied along the difficult magnetization axis in the "free" layer to reduce its reversal field, and the other field being applied along the easy magnetization axis, in order to generate a reversal of the magnetization and to write the memory cell. In principle, only the memory cell located at the intersection of lines is subject to reversal, since each magnetic field taken individually is insufficient to cause reversal of the magnetization.

As memory cell size is reduced, the minimum allowable switching field (needed to meet activation energy requirement) is increased leading to larger write currents. Environmental factors such as temperature variations can adversely affect the write select margin. This is because the energy content of smaller memory cells get closer to thermal fluctuations (kT). Referring to FIG. 3 again, this fact is reflected in the data points on the vertical axis at the switching currents of 11 mA and 13 mA, for MRAMs in which error detection and correction is not used.

In FIG. 3, estimated switching currents needed to meet 1 error in 10 years is displayed for different TJ widths. The switching currents and the TJ widths are displayed for data points represented for cases in which ECC is also used, for various word lengths. In the example displayed in FIG. 3, a rate of 1 refresh per day was utilized with the assumption that continuous reading and random writing operations was performed on a 256 Mbit MRAM chip.

The error rate of an MRAM chip, depends mainly on the level of the activation energy (switching) at zero field Ea(0). For a cell with shape anisotropy and a single free layer, it is determined that the energy Ea depends on three factors: 1) the switching field, 2) the free-layer's volume, and 3) a correction factor, which gets close to one for small cells (<200 nm).

In order to minimize soft errors to about 1 error in 10 years of device operation, assuming continuous reading and some writing operations, a relatively high activation energy Ea(0) of about 200 kT is required. In a scaled down cell, the reduction in volume must be compensated by an increase in free-layer thickness. Unfortunately, however, an increase in the thickness of the free layer results in a drastic increase in the switching-field (Hk).

As shown in FIG. 3, when no error correction is utilized, much more current is needed for writing small cells, as compared to large ones. For example, in the case where ECC is used, the current needed for the small cell (100 nm) is at around 13 mA, as shown, as compared to the current needed for the larger cell (200 nm), which is shown to be about 11 mA.

Error correction and detection relaxes the requirement for activation energy, however, since more failures can be tolerated. This is true in cases where a refresh of the memory is performed once a day, i.e. once every $10^{12}$ pulses, and in cases where refresh occurs once in every hour of operation, in which case the amount of tolerable errors is even higher. In some instances, error detection and correction permits currents to be reduced by up to 30%. For small TJs (<150 nm width), even the size of the integrated circuit can be reduced by up to 35%, even though additional bits for ECC may be needed in such circumstances.

Referring back to FIG. 3, in almost all cases both for the larger (200 nm) TJs and the smaller (100 nm) TJs, the utilization of ECC permits a reduction in the switching current. For the larger (200 nm) TJs, the switching current is reduced from 10.5 mA to a range varying between 7 and 8 mA depending on the word length when ECC is used. Consequently, for a smaller TJ, the corresponding current is reduced from 13 mA to a range varying between 8.5 to 9.5 mA with the use of ECC. Refresh cycles can also relax the requirement for activation energy, similar to ECC. The refresh cycle, clears the data from the stream including the errors and thus allow for toleration of more errors.

Unfortunately, using only ECC alone or merely refreshing with ECC at fixed time intervals does not provide an appropriate solution. When the storage area is being refreshed, it can neither be written nor read from. Accordingly, availability of access is sacrificed, if the storage area is refreshed too frequently. In an alternative embodiment of the invention, however, the disadvantages and dependencies of refresh cycle can be further reduced by taking advantage of the benefits of relying on error detection and correction. In this embodiment, instead of a refresh cycle being provided at fixed time intervals, such a cycle is triggered by half select pulse counters for either the entire MRAM or for a selected sub-array thereof. Counters can be used as well, as depicted in FIG. 2. For example, as shown in FIG. 2, the ECC processor (220) can update an error counter to cause the storage area to be refreshed after a particular number of errors has been detected, or, alternatively, when a particular number of errors has not been detected. In addition, there are intervals when no write operations are performed to a particular MRAM or sub-array of the MRAM, for example, when the storage area is either inactive or only read from time to time. In such intervals in which no write operations are being performed, a refresh operation can be omitted for the MRAM or the sub-array.

In some cases, it can be advantageous to sort data into special subsets or groups, namely special sub-arrays, for long and short term storage, in order to minimize refresh cycles. In instances where the refresh cycle is determined by a timer or a global counter, as known to those skilled in the art, the write operations can be distributed statistically over the whole array, in order to prevent the accumulation of too many half-select errors in a specific sub-array.

One of the disadvantages of using ECC is the need of to store check bits associated with the data bits. In a computer system having b bits of memory available per chip, the failure of a chip can cause one to b erroneous bits in the output data, depending upon the failure mode and the data, that is originally stored. A b bit symbol error pattern is used to indicate one of all of the possible $2^{b-1}$ error patterns in the b bits for each computer chip. This requires that a number of dedicated check bits be set aside for error detection and correction. Consequently, in many ECC codes such as Hamming codes, as known to those skilled in the art, b additional bits are needed in order to correct one failure in a word having a length of less than or equal to $2^{b-1}$ bits. For example, for an 8 (i.e. $2^{4-1}$) bit or 128 (i.e. $2^{8-1}$) bit word, this translates into 4 to 8 additional required bits, respectively. This is normally not very attractive, since the additional bits and additional logic circuits needed to implement the error detection and correction consume too much space on a chip.

There are other limits associated with the use of error correction code. One such limitation is that only one failure is allowed to occur in a word in a certain time interval, until the word is either read out, or refreshed and corrected. It should also be noted that the number of write pulses used for error correction is small compared to the total number of write pulses in a refresh cycle, and that a minimum activation energy is needed to prevent more than one failure per word, in the case of a long non-operational period of the device. By providing error correction and detection, the lower limit for activation energy can be reduced to as low as Ea(0) about 50 kT.

The invention addresses both these concerns in the following manner. Because Ea(0) can be reduced to about 50 kT by using error detection and correction, the switching fields can also be reduced. This reduces both current and integrated circuit area, since the current voltage switches (CVS) on each end of the array, used in the manner as known to those skilled in the art, can be reduced in size due to the reduced switching currents. There is a certain TJ size where the space consumption by additional bits will be compensated by the space saving due to reduced CVS size. This means that the attractiveness or unattractiveness of providing error detection and correction depends not only on the word length, but also on the TJ size. This concept can be better understood with reference to the diagram of FIG. 4.

Figure 4:
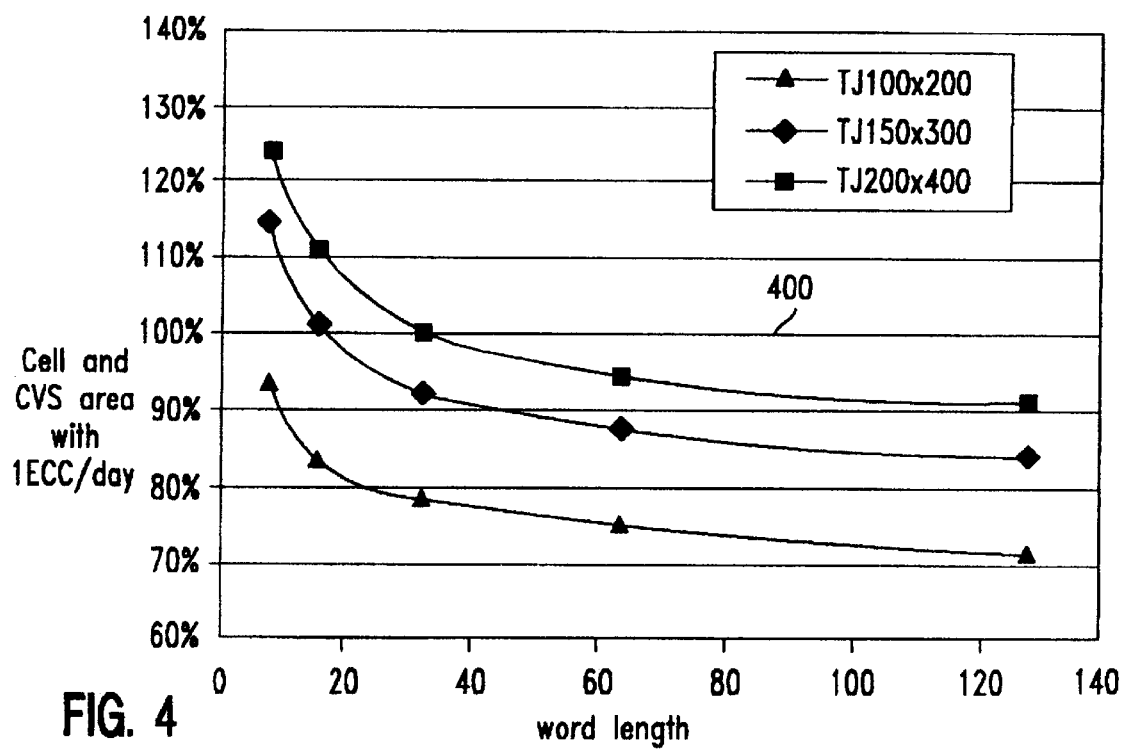
FIG. 4 is a diagram showing a relationship between the size of a current voltage switch (CVS) as a function of word length, and different TJ widths.

FIG. 4 illustrates a mathematical calculation of the relative sizes of the MRAM cell and current voltage switch, for different word lengths and several different TJ sizes, for a case in which a refresh cycle is performed once a day, with error detection and correction. In FIG. 4, the horizontal line 400 shown going across the 100% mark represents a base-line MRAM cell and CVS size when error detection and correction is not used. Comparing the other curves which show the relative MRAM cell and CVS sizes for MRAMs having error detection and correction, it is apparent from the TJ widths indicated, the use of error detection and correction permits the MRAM cell and CVS size to be up to about 30%, depending on the word length stored therein. For MRAMS having ECC and long word lengths, the size of the MRAM cell and CVS are about 70% compared to the 100% size for MRAMs that do not have ECC. Consequently, in MRAMs having error detection and correction, MRAM integrated circuit area can be reduced. Note that as discussed, the amount that the MRAM integrated circuit area can be reduced increases with the word length, because fewer ECC check bits are needed in proportion to the number of data bits. However, for word lengths of more than about 64 bits, the reduction in the size of the MRAM cell and CVS begins to level off. A reason for this is that at such longer word lengths, the larger number of (half-selected) cells for large words increases the activation energy Ea(0), thereby requiring greater currents to be used in such case.

Figure 5:
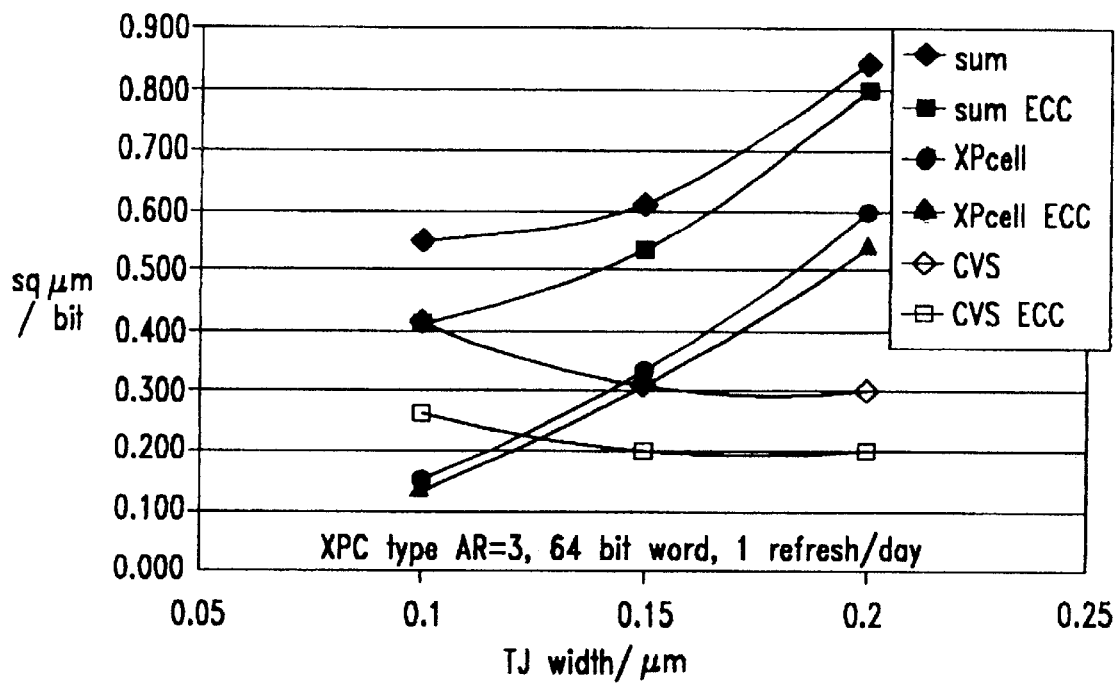
FIG. 5 is a diagram illustrating a comparison between required sizes of current voltage switches of an MRAM, for examples with and without the use of error correction code (ECC), for cross point cell designs and different TJ widths.

FIG. 5 provides a comparison of calculated cell size and CVS size, in square um per bit, for cases in which error correction and detection is not used, and for cases in which it is used in a cross-point MRAM of 64 bit word length, for different TJ widths of 100 nm, 150 nm and 200 nm aspect ratio 3). In the illustrative example of FIG. 5, results are based on use of a Hamming code as the ECC and one refresh cycle per day.

Comparing the three Figures (FIGS. 3 through 5), several things are apparent. In FIG. 3 and FIG. 4, scaling down MRAM cell size without ECC, and with no other measures to reduce currents, such as ferromagnetic liners, leads to prohibitively high currents (>10 mA). This slows down scaling of the MRAM integrated circuit area, as indicated in FIG. 5.

For fast MRAMs, a different scenario can be introduced based on an alternative embodiment of the present invention. This includes a method of emulating a NAND flash memory with an MRAM having error detection and correction. Since NAND flash memory is known to those skilled in the art, it need not be described here in detail.

Fast (50 ns) memories having I/O word widths of multiples of 8 bits (×8) require ECC bits to be based on 8 bit word portions, leading to significant ECC check bit overhead. This concept can be best understood by use of an illustrative example. Assume a case in which an expected soft error rate of 1 in 1024 bits occurs over a time period of 10 years, and 128 serial cycles are performed to read word portions of 8 bit widths, for a 128×8 bit I/O word. In such case, 4 ECC check bits are required for every 8 data bits output, in order to correct 1 error in the 8 data bits in a timely manner, resulting in a 50% (4 out of 8) bit overhead. In one embodiment of the present invention, where a NAND Flash (700) is used as shown in FIG. 7 to address such situation. However, in a mode emulating a NAND flash memory in which access is generally slow compared to that described above, by appropriate use of a large buffer, to store the 1024 bits read from the memory, and performing error detection and correction on the buffered data, the number of ECC check bits needed to detect and correct 1 error in the 1024 bit I/O word can be held to 11, representing the addition of just a 1% ECC check bit overhead for the 1024 total number of bits in the I/O word.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. In a magneto-resistive random access memory (MRAM), a method of reducing data errors comprising the steps of:

storing data bits and associated error correction code (ECC) check bits into a storage area;

reading out said data bits and said associated ECC check bits; and checking and correcting said data bits using said associated ECC check bits; and refreshing data bits and associated ECC check bits stored in said storage area by accessing said stored data bits and said associated ECC check bits, checking and correcting said data bits using said associated ECC check bits, and restoring said data bits and said ECC check bits to said storage area, wherein said refreshing is initiated based on a count.

2. The method of claim 1, wherein said count measures errors upon checking said data bits using said associated ECC check bits.

3. The method of claim 1, wherein said refreshing is performed at fixed time intervals.

4. The method of claim 1, wherein said refreshing is performed based on a number of times a half select pulse has been provided to said MRAM.

5. The method of claim 2, wherein said refreshing is performed based on a number of times a half select pulse has been provided to a sub-array of said MRAM.

6. The method of claim 1, further comprising determining intervals in which said MRAM is not being written, and omitting said refreshing during said intervals.

7. The method of claim 6, wherein said data bits and ECC check bits are stored to a plurality of portions of said MRAM according to different lengths of time said data bits are expected to be stored.

8. The method of claim 1, wherein said refresh cycle is performed based on at least one of a time interval and a global counter.

9. The method of claim 1, wherein said data bits and ECC check bits are stored to locations distributed statistically over an array of said MRAM.

10. The method of claim 1, wherein said ECC check bits include parity bits.

11. The method of claim 1, wherein said data bits have values of either "0" or "1", associated with different MRAM resistance states.

12. The method of claim 11, wherein said MRAM comprises a plurality of tunnel junction (TJ) memory cells each having at least two magnetic layers separated by a barrier layer, at least one of said magnetic layers having an associated magnetic field that can be selectively switched between an anti-parallel state having a high device resistance, to a parallel state having a low device resistance.

13. The method of claim 12, wherein said storing is performed using lowered magnetic field inducing currents such that said TJ memory cells are subject to a statistically significant percentage of unintended magnetization state reversal.

14. The method of claim 13, wherein said storing is performed to TJ memory cells of said MRAM having reduced size, such that a statistically significant percentage of said TJ memory cells are subject to unintended magnetic state reversal.

15. The method of claim 14, wherein area required for storing said ECC check bits is provided by reduction in area of said MRAM from reducing size of said TJ memory cells.

16. The method of claim 12, wherein said data bits and ECC check bits are stored as words of a fast MRAM having a short word length.

17. The method of claim 16, wherein a cycle time for reading out said stored data bits and said ECC check bits is about 50 ns or less.

18. The method of claim 12, further comprising emulating a flash memory, such that a number of said ECC check bits is reduced in proportion to said data bits.

19. The method of claim 12, wherein said operations of storing said data bits and said ECC check bits and said reading out said data bits and said ECC check bits are performed at cycle times which are selectively lengthened.

20. A magneto-resistive random access memory (MRAM) comprising:

an input output interface adapted to receive and transmit a plurality of data bits; and an ECC processor coupled to said input output interface and to a storage area, adapted to generate error correction code (ECC) check bits corresponding to a plurality of received data bits prior to storing the plurality of received data bits and ECC check bits in the storage area, and to check and correct any errors in data bits retrieved from the storage area using the ECC check bits retrieved from the storage area.

* * * * *